United States Patent
Li et al.

(10) Patent No.: US 9,037,952 B2
(45) Date of Patent: May 19, 2015

(54) MEMORY ARCHITECTURE FOR LAYERED LOW-DENSITY PARITY-CHECK DECODER

(71) Applicant: LSI Corporation, San Jose, CA (US)

(72) Inventors: Zongwang Li, Dublin, CA (US); Yang Han, Sunnyvale, CA (US); Kaichi Zhang, San Jose, CA (US); Chung-Li Wang, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 143 days.

(21) Appl. No.: 13/760,609

(22) Filed: Feb. 6, 2013

(65) Prior Publication Data
US 2014/0223259 A1    Aug. 7, 2014

(51) Int. Cl.
*H03M 13/00* (2006.01)
*G06F 11/10* (2006.01)
*H03M 13/11* (2006.01)
*H03M 13/27* (2006.01)

(52) U.S. Cl.
CPC ........... *G06F 11/10* (2013.01); *H03M 13/1137* (2013.01); *H03M 13/116* (2013.01); *H03M 13/2707* (2013.01); *H03M 13/6505* (2013.01); *H03M 13/6566* (2013.01)

(58) Field of Classification Search
CPC .................................................. H03M 13/1108
USPC ........................................... 714/752, 786, 801
See application file for complete search history.

(56) References Cited

U.S. PATENT DOCUMENTS

| | | | | |
|---|---|---|---|---|
| 8,245,098 B2* | 8/2012 | Han et al. | ....................... | 714/752 |
| 8,418,023 B2* | 4/2013 | Gunnam et al. | ............... | 714/758 |
| 8,489,962 B2* | 7/2013 | Dielissen | ....................... | 714/758 |
| 8,504,892 B2* | 8/2013 | Heinrich et al. | ............... | 714/758 |
| 8,578,256 B2* | 11/2013 | Graef | ............................ | 714/801 |
| 2010/0088575 A1 | 4/2010 | Sharon et al. | | |

\* cited by examiner

*Primary Examiner* — Esaw Abraham
(74) *Attorney, Agent, or Firm* — Suiter Swantz pc llo

(57) ABSTRACT

A hard decision memory interacts with a multi-layered low-density parity-check decoder by sending multiple L values and E values to a multi-layered low-density parity-check decoder (LDPC), and the L value E value hard decision memory (LE hard decision memory) receives one or more hard decisions. The LE hard decision memory comprises a global mapping element to interleave L values from a first and second circulant and store the interleaved values in a first memory element. A low-density parity-check decoder then processes the circulants from the first memory element and stores output in a second memory element. The LE hard decision memory does not include any mux-demux elements. The use of the LE hard decision memory results improved multi-level LDPC decoding of an LDPC encoded message.

20 Claims, 7 Drawing Sheets

| 602 | 604 | 606 | 608 | 610 | 612 | 614 | 616 | 618 | 620 | 622 | 624 |
|---|---|---|---|---|---|---|---|---|---|---|---|
| 105 | 97 | 65 | 99 | 85 | 108 | 71 | 108 | 93 | 108 | 63 | 105 |
| 75 | 106 | 103 | 106 | 95 | 104 | 33 | 104 | 78 | 102 | 100 | 101 |
| 83 | 89 | 57 | 86 | 53 | 90 | 67 | 98 | 22 | 83 | 98 | 99 |
| 102 | 103 | 87 | 102 | 91 | 101 | 7 | 96 | 70 | 100 | 25 | 92 |
| 5 | 65 | 30 | 85 | 47 | 72 | 46 | 93 | 97 | 73 | 93 | 83 |
| 96 | 95 | 69 | 95 | 107 | 94 | 107 | 87 | 55 | 96 | 2 | 91 |
| 86 | 57 | 27 | 74 | 89 | 71 | 15 | 72 | 89 | 71 | 90 | 73 |
| 94 | 87 | 14 | 91 | 100 | 88 | 92 | 84 | 107 | 92 | 106 | 80 |
| 72 | 49 | 20 | 64 | 57 | 67 | 99 | 47 | 74 | 64 | 74 | 67 |
| 88 | 80 | 94 | 82 | 81 | 84 | 79 | 80 | 103 | 88 | 104 | 75 |
| 64 | 37 | 105 | 56 | 50 | 63 | 97 | 40 | 65 | 63 | 53 | 54 |
| 79 | 76 | 84 | 78 | 75 | 82 | 77 | 78 | 101 | 81 | 79 | 69 |
| 56 | 34 | 98 | 53 | 42 | 56 | 86 | 39 | 31 | 54 | 40 | 37 |
| 68 | 69 | 81 | 68 | 70 | 76 | 60 | 70 | 82 | 77 | 76 | 62 |
| 50 | 30 | 90 | 49 | 37 | 46 | 85 | 34 | 26 | 50 | 36 | 30 |
| 58 | 59 | 77 | 61 | 66 | 52 | 59 | 66 | 62 | 58 | 68 | 61 |
| 40 | 27 | 73 | 47 | 34 | 36 | 54 | 32 | 16 | 42 | 29 | 26 |
| 48 | 51 | 60 | 43 | 62 | 51 | 41 | 61 | 59 | 45 | 66 | 52 |
| 36 | 22 | 46 | 39 | 31 | 32 | 49 | 28 | 12 | 39 | 28 | 23 |
| 44 | 45 | 52 | 35 | 25 | 43 | 38 | 58 | 50 | 35 | 60 | 45 |
| 29 | 20 | 42 | 29 | 28 | 26 | 31 | 13 | 10 | 32 | 18 | 8 |
| 33 | 41 | 48 | 24 | 11 | 33 | 24 | 55 | 44 | 25 | 55 | 41 |
| 19 | 18 | 23 | 19 | 20 | 19 | 16 | 22 | 9 | 27 | 12 | 5 |
| 21 | 14 | 38 | 13 | 6 | 7 | 21 | 48 | 43 | 21 | 44 | 35 |
| 10 | 9 | 12 | 10 | 8 | 15 | 8 | 17 | 4 | 17 | 9 | 4 |
| 13 | 11 | 3 | 1 | 3 | 1 | 11 | 6 | 38 | 2 | 24 | 7 |

MEMORY ARCHITECTURE FOR LAYERED LOW-DENSITY PARITY-CHECK DECODER

BACKGROUND OF THE INVENTION

Iterative decoding algorithms for low-density parity-check codes allows a high degree of parallelism in processing, favoring the design of high throughput architectures of the decoder. However, routing congestion and memory collision might limit a practical exploitation of the inherent parallelism a decoding algorithm. In order to solve this problem, codes are designed with a block structure (having blocks of size P) that naturally fit with the vectorization of the decoder architecture, thus guaranteeing a collision-free parallelism of P.

Multi-level low-density parity-check codes have much better performance than binary low-density parity-check codes. However, they also have much greater hardware complexity than binary low-density parity-check code decoders, which leads to prohibitively large size and power consumption in hardware.

Consequently, it would be advantageous if an apparatus existed that is suitable for multi-level low-density parity-check code decoding with reduced complexity and power consumption.

SUMMARY OF THE INVENTION

Accordingly, the present invention is directed to a novel method and apparatus for multi-level low-density parity-check code decoding with reduced complexity and power consumption.

One embodiment of the present invention is a memory architecture for storing two circulants simultaneously. The memory architecture includes memory modules connected directly to mapping elements and a low-density parity-check decoder.

Another embodiment of the present invention is a low-density parity-check decoder configured to utilize a memory architecture where memory modules are connected directly to mapping elements. The decoder is configured to process more than one circulant simultaneously.

Another embodiment of the present invention is a method for decoding a low-density parity-check encoded message by processing more than one circulant simultaneously. The method includes storing circulants in a memory architecture where memory modules are connected directly to mapping elements.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which:

FIG. 6 shows a schematic of a twelve layer decoder order for an exemplary low-density parity-check code;

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
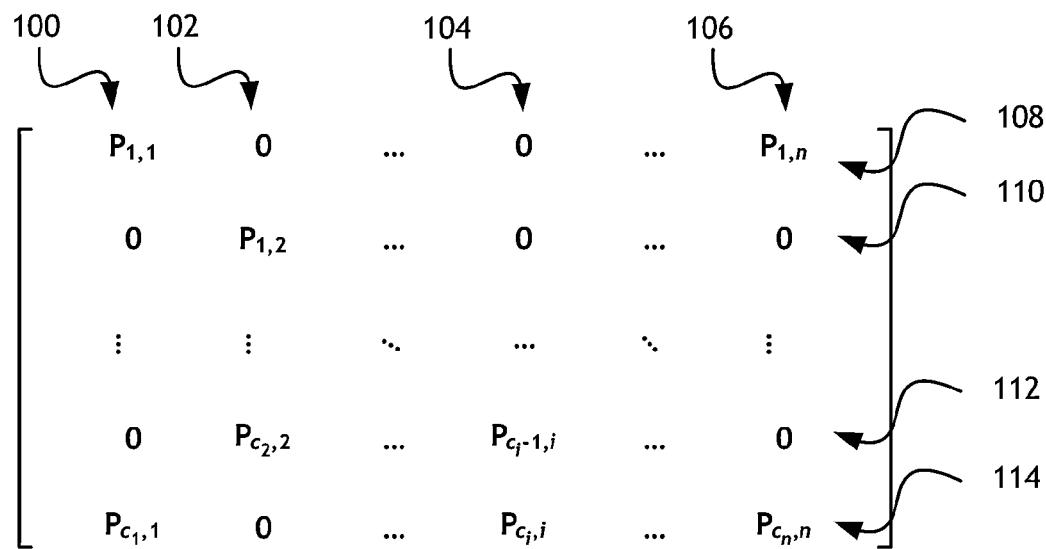
FIG. 1 Shows a general parity check matrix for a low-density parity-check decoder.

Referring to FIG. 1, a general parity check matrix for a low-density parity-check decoder is shown. In a parity check matrix, each column 100, 102, 104, 106 represents a check node and each row 108, 110, 112, 114 represents a variable node. Connections between variable nodes and check nodes are represented in the parity check matrix wherever the matrix contains a non-zero value. In at least one embodiment of the present invention, each non-zero value in the parity check matrix $P_{1,1}, P_{1,n}, P_{1,2}, P_{c_2,2}, P_{c_i-1,i}, P_{c_i,1}, P_{c_i,i}, P_{c_n,n}$) is a circulant matrix.

Figure 2:
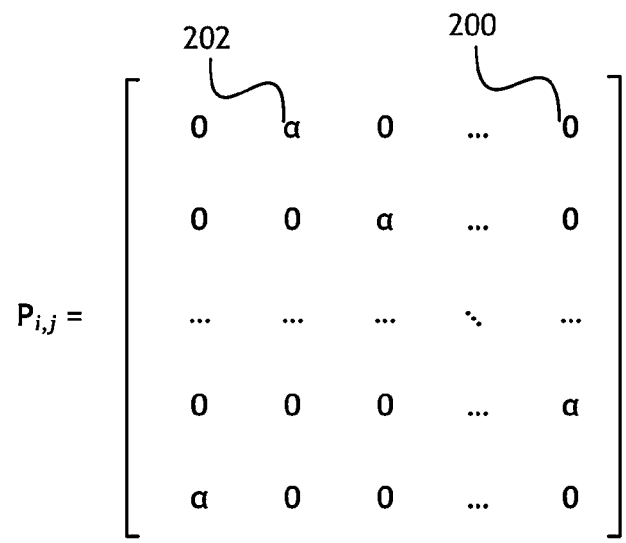
FIG. 2 Shows a circulant matrix representing an element in a parity check matrix.

Referring to FIG. 2, a circulant matrix representing an element in a parity check matrix is shown such as shown in FIG. 1. Circulant matrixes are square matrixes that are fully defined by a single column. In at least one embodiment of the present invention, a circulant matrix includes columns having zero elements 200 and non-zero elements 202 that are defined as an element over a Galois field having $2^q$ elements.

Figure 3:
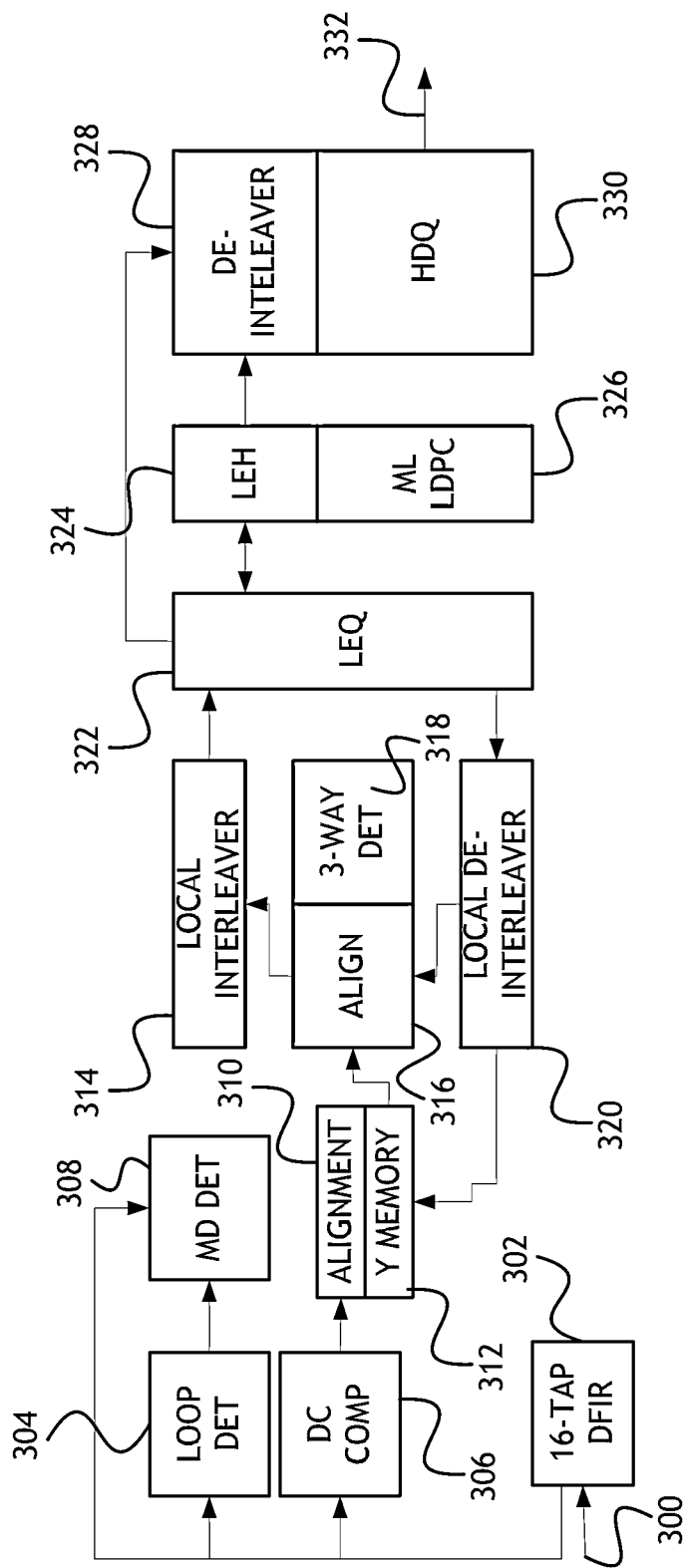
FIG. 3 Shows a system architecture for a layered low-density parity-check decoder.

Referring to FIG. 3, a block diagram of a multi-level system for iteratively decoding a low-density parity-check message is shown. In at least one embodiment of the present invention, the system includes a sixteen tap digital finite impulse response circuit 300. The digital finite impulse response circuit 300 receives low-density parity-check encoded messages, in one embodiment at a rate of four samples per cycle. The output from the digital finite impulse response circuit 300 is sent to a DC comparator 306, a loop detector 304 and a MD detector 308.

In at least one embodiment of the present invention, output from the DC comparator 306 is sent to a first alignment unit 310 to align low-density parity-check encoded bits in a low-density parity-check block. Certain corner points of the aligned bits are stored in a Y memory unit 312. Y messages in the Y memory unit 312 are sent to a second alignment unit 316 to align bits in one or more Y messages and bits in one or more L values or E values received from a local de-interleaver 320. The second alignment unit 316 receives Y messages, in at least one embodiment at a rate of eighteen samples per cycle, and L values or E values, in at least one embodiment at a rate of nine samples per cycle. During alignment by the second alignment unit 316, Y messages are processed by a three-way detector 318.

In at least one embodiment of the present invention, the second alignment unit 316 sends aligned bits to a local interleaver 314; the local interleaver 314 interleaves values and sends the interleaved messages to a LE queue 322. The LE queue 322 sends interleaved L values or E values to the local de-interleaver 320. The LE queue 322 also sends interleaved L values or E values to a LE hard decision memory 324. The LE hard decision memory 324 includes elements of a LE memory and a hard decision memory. The LE hard decision memory 324 interacts with a multi-layered low-density parity-check decoder 326 by sending multiple L values and E values to the multi-layered low-density parity-check decoder 326 and receiving one or more hard decisions. The LE hard decision memory 324 returns interleaved L values or E values to the LE queue 322 for further processing if necessary. Alternatively, the LE hard decision memory 324 and LE queue 322 send interleaved L values or E values to a de-interleaver 328. The de-interleaver 328 de-interleaves the L values and E values and transfers hard decisions to a hard decision queue 330. The hard decision queue 330 then outputs those hard decisions 332.

Figure 4:
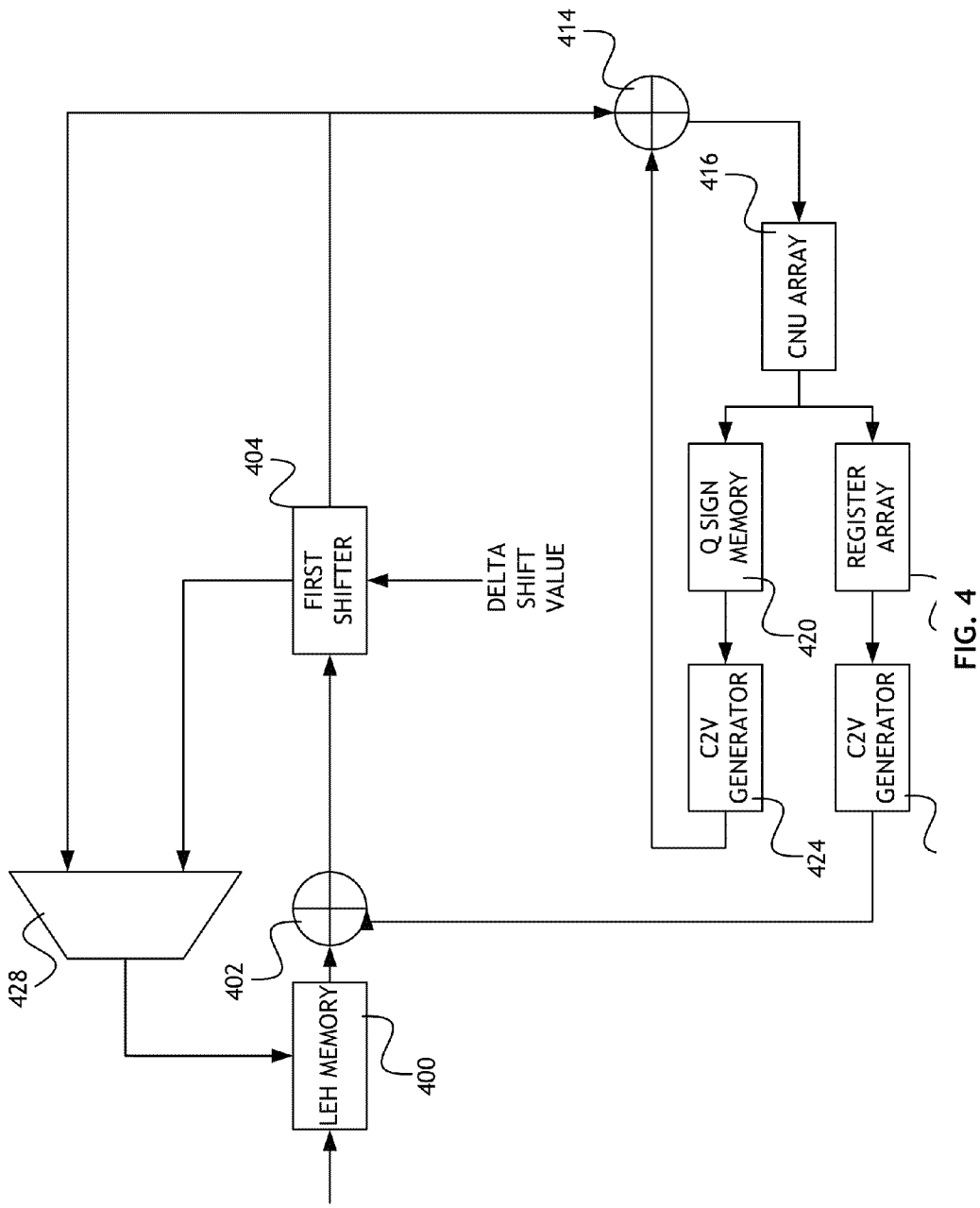
FIG. 4 Shows a block diagram of a multi-level system for iteratively decoding a low-density parity-check message.

Referring to FIG. 4, a system architecture for a layered low-density parity-check decoder is shown. In at least one embodiment of the present invention, the layered low-density parity-check decoder includes a LE hard decision memory 400. The LE hard decision memory 400 stores log likelihood ratios and receives an initial log likelihood ratio. The LE hard decision memory 400 is connected, through a first additive element 402, to a first shifter element 404. The first shifter element 404 receives a delta shift value as further defined herein. The first shifter element 404 bit-shifts the signal received from the LE hard decision memory 400 based on the delta shift value. The first shifter element 404 then sends the bit-shifted signal to a second additive element 414. The output from the second additive element 414 comprises a Q type message. Q type messages are messages sent from a group of variable nodes to a group of check nodes.

The second additive element 414 sends its Q type message output to a check node unit array 416. The check node unit array 416 includes a series of comparators for comparing bits in one or more Q type messages. The output from the check node unit array 416 is sent to a register array 418 and a Q sign memory 420. The register array 418 stores variables from one or more check node units from the check node unit array 416. The Q sign memory 420 stores Q sign bits.

The signal from the register array 418 is sent to a first capacitance-to-voltage generator 422. The output from the Q sign memory 420 is sent to a second capacitance-to-voltage generator 424. The output from the second capacitance-to-voltage generator 424 (comprising an old R value) is sent to the second additive element 414 and combined with the bit-shifted signal from the first shifter element 404.

The output from the first capacitance-to-voltage generator 422 (comprising a new R value) is then sent to the first additive element 402 to be combined with a log likelihood ratio from the LE hard decision memory 400.

The Q type message from the second additive element 414 and the bit-shifted signal from the first shifter element 404 are each received by a mux 428 to produce a multiplexed signal that comprises an updated log likelihood ratio that is received by the LE hard decision memory 400.

By updating the LE hard decision memory 400 through the mux 428 and updating the check node unit array 416, the system may iteratively adjust R values in a layered architecture until the system reaches a stable output. The system of FIG. 4 is operative to decode a generalized low-density parity-check code, but the system requires a specialized LE hard decision memory 400.

Figure 5:
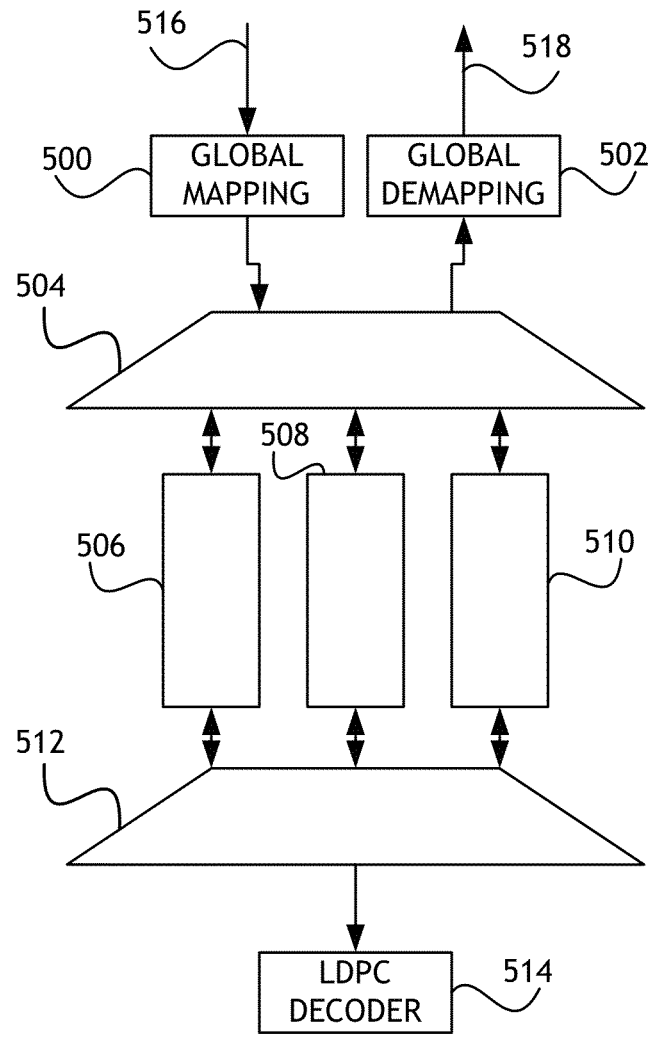
FIG. 5 Shows a block diagram of a LE hard decision memory structure for parallel decoding with two circulants.

Referring to FIG. 5, a block diagram of a LE hard decision memory structure for parallel decoding with two circulants is shown. A LE hard decision memory includes one L value port 516 to receive L values. L values may be interleaved by a global mapping log likelihood ratio force circuit interleaver 500 and sent to a first mux-demux 504 that directs the resulting signal to one of three data storage banks 506, 508, 510 in the LE hard decision memory.

The three data storage banks 506, 508, 510 are connected to a second mux-demux 512 that selects values from one of the three data storage banks 506, 508, 510 to send to a low-density parity-check decoder 514. The decoder 514 performs some iterative decoding operations and returns a value, through the second mux-demux 512 to one of the three data storage banks 506, 508, 510. The LE hard decision memory also includes a global mapping log likelihood ratio force circuit de-interleaver 502 to read E values, through the first mux-demux 504, from one of the three data storage banks 506, 508, 510 and send de-interleaved E values to a LE-queue port 518 connected to a LE-queue.

Referring to FIG. 6, a schematic of a twelve layer decoder order for an exemplary low-density parity-check code is shown. An exemplary low-density parity-check code useful in at least one embodiment of the present invention comprises one-hundred eight bit messages. In at least one embodiment of the present invention, messages according to such a code are decoded in twelve layers 602, 604, 606, 608, 610, 612, 614, 616, 618, 620, 622, 624. In at least one embodiment, each of the twelve layers 602, 604, 606, 608, 610, 612, 614, 616, 618, 620, 622, 624 comprises twenty-six bits 600; each bit 600 representing one bit of a message. Each layer 602, 604, 606, 608, 610, 612, 614, 616, 618, 620, 622, 624 includes bits 600 based on indexes defined by a parity-check table. The layers 602, 604, 606, 608, 610, 612, 614, 616, 618, 620, 622, 624 in FIG. 6 show message indexes.

Figure 7:
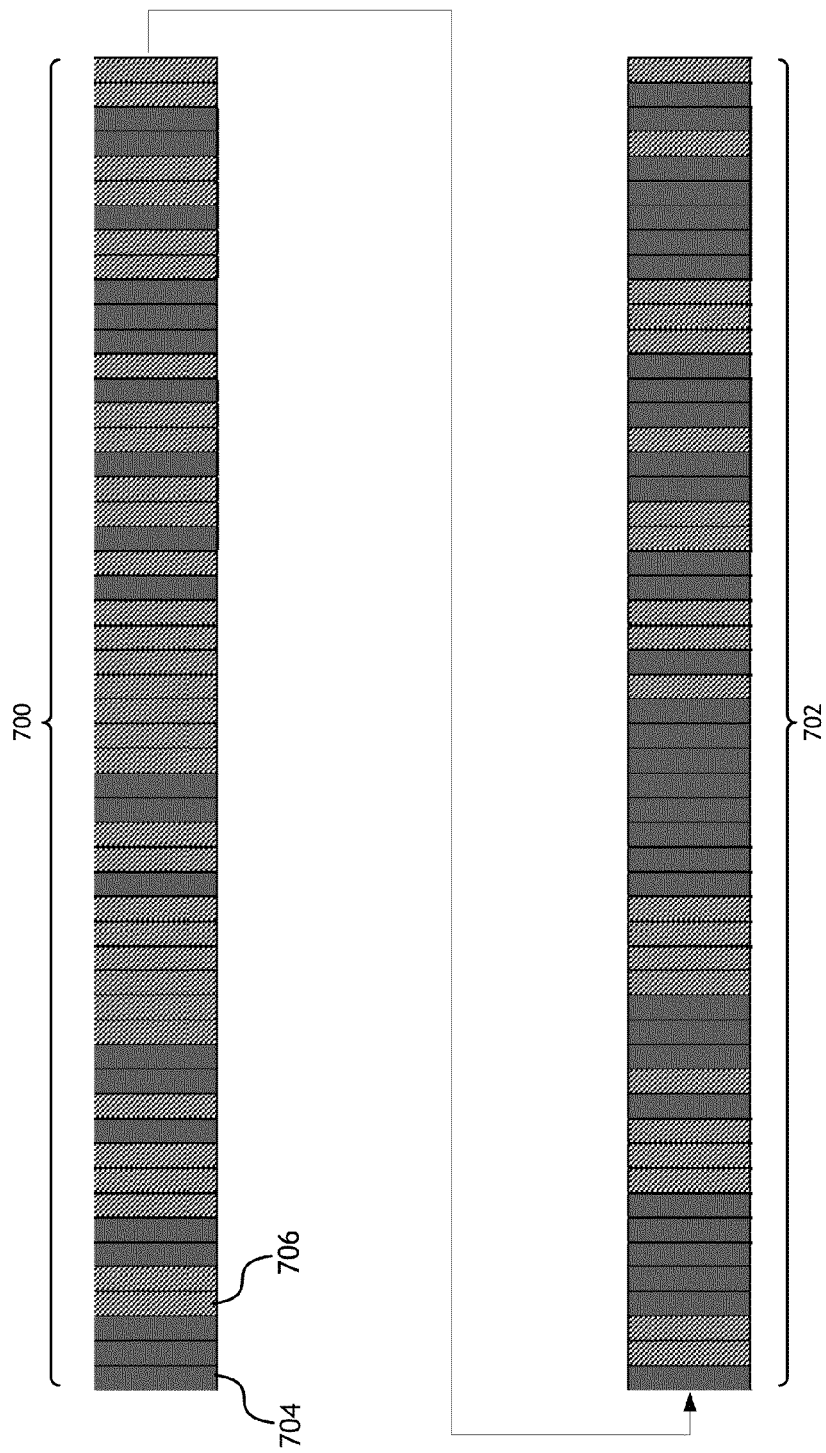
FIG. 7 shows a block diagram of a memory organization for use in a LE hard decision memory according to one embodiment of the present invention.

Referring to FIG. 7, a block diagram of a memory organization for use in a LE hard decision memory according to one embodiment of the present invention is shown. In an exemplary embodiment of the present invention, a LE hard decision memory has data storage banks for storing two circulants simultaneously. For convenience, the data storage banks are shown in two sets 700, 702, though in actual application, data storage banks could be continuous. A first data storage bank 700 comprises memory addresses one through fifty-four and a second data storage bank 702 comprises memory addresses fifty-five through one hundred eight. Memory addresses are allocated between the two circulants to prevent memory conflicts. In this exemplary embodiment, the first address 704, and all other data banks represented by a solid block, are allocated to a first circulant while the fourth address 706, and all of the other data banks represented by cross-hatched blocks, are allocated to a second circulant. Memory addresses 704, 706 are allocated between circulants according to a parity check matrix.

Figure 8:
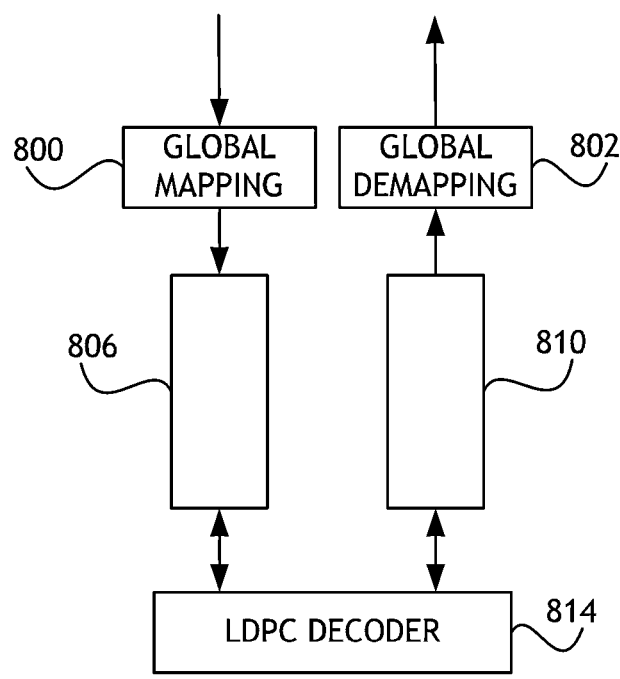
FIG. 8 Shows a block diagram of a LE hard decision memory structure for parallel decoding with two circulants according to the present invention.

Referring to FIG. 8, a block diagram of a LE hard decision memory structure for parallel decoding with two circulants according to the present invention is shown. Where a parity-check code is organized to produce decoder layers according to FIG. 6 and memory addresses allocated according to FIG. 7, a LE hard decision memory according to at least one embodiment of the present invention can include a global mapping element 800 to interleave two circulants and store them in a first memory element 806.

A low-density parity-check decoder 814 then receives interleaved circulants form the first memory element 806 and performs iterative decoding operations. The output from the iterative decoding operations is stored in a second memory element 810. A global de-mapping element 802 then de-interleaves the data stored in the second memory element 810 and sends the de-interleaved values (in at least one embodiment comprising E values) to a LE-queue.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A communication system comprising:
    an L value E value (LE) hard decision memory comprising:
        a first memory element configured to store two circulants; and
        a second memory element configured to store one or more outputs from a decoding operation performed on two circulants;
    an first additive element connected to the first memory element of the LE hard decision memory, configured to combine data from the first memory element and a R value;
    a bit-shifter connected to the first additive element, the bit-shifter configured to receive a delta shift value and produce a P value;
    a second additive element connected to the bit-shifter, configured to receive an old R value;
    a mux connected to the second additive element and the bit-shifter, configured to output one of an output from the bit-shifter or an output from the second additive element to the second memory element of the LE hard decision memory;
    a check node unit array connected to the second additive element;
    a Q sign memory configured to store Q sign bits;
    a first current-to-voltage generator connected the Q sign memory, configured to produce an old R value and send the old R value to the second additive element;
    a register array connected to the check node unit array, configured to store one or more variable form one or more check node units; and
    a second current-voltage generator connected the register array, configured to produce a new R value and send the new R value to the first additive element.

2. The communication system of claim 1, further comprising a global mapping element connected to the first memory element, configured to interleave two circulants.

3. The communication system of claim 1, further comprising a global de-mapping element connected to the second memory element, configured to de-interleave an output comprising two E values.

4. The communication system of claim 1, wherein the first memory element is configured to store data associated with a first circulant in specific memory addresses.

5. The communication system of claim 1, wherein the communication system is configured to decode a low-density parity-check code encoded message by processing two or more layers.

6. The communication system of claim 5, wherein the two or more layers are configured to utilize a memory architecture comprising:
    a global mapping element;
    a first memory element directly connected to the global mapping element;
    a global de-mapping element; and
    a second memory element directly connected to the global de-mapping element.

7. The communication system of claim 6, further comprising a global mapping element connected to the first memory element, configured to interleave two circulants according to at least one constraint associated with the two or more layers.

8. The system of claim 1, wherein the first memory element configured to store two circulants is further configured to store two circulants simultaneously, and the second memory element configured to store one or more outputs from a decoding operation performed on two circulants is further configured to store one or more outputs from a decoding operation performed simultaneously on two circulants.

9. The system of claim 8, further comprising a sixteen tap digital finite impulse response circuit adapted to receive one or more encoded messages, a comparator, and at least one detector, wherein at least one of the comparator and the at least one detector is adapted to receive an output from the sixteen tap digital finite impulse response circuit.

10. The system of claim 9, further comprising a first alignment unit, a second alignment unit, a bit-storing memory unit, and a three-way detector, wherein the first alignment unit is adapted to receive an output from the at least one comparator, wherein the bit-storing memory unit is adapted to store one or more aligned bits, wherein the second alignment unit is adapted to receive one or more messages from the bit-storing unit, wherein the three-way detector is adapted to receive one or more messages from the second alignment unit.

11. The system of claim 10, further comprising a local interleaver, an L value E value (LE) queue, and a local de-interleaver, wherein the local interleaver is adapted to receive one or more aligned bits from the second alignment unit, wherein the LE queue is adapted to receive one or more messages from the local interleaver, wherein the local de-interleaver is adapted to receive one or more L value or one or more E value from the LE queue, and wherein the LE queue is adapted to send one or more interleaved values to the LE hard decision memory.

12. A method for performing layered low density parity check (LDPC) decoding comprising:
    storing in a first memory element of an L value E value (LE) hard decision memory two circulants;
    storing in a second memory element of the LE hard decision memory one or more outputs from a decoding operation performed on the two circlulants;
    combining an R value and data from the first memory element in a first additive element connected to the first memory element of the LE hard decision memory;
    receiving a delta shift value in a bit-shifter connected to the first additive element to produce a P value;
    receiving an old R value in a second additive element connected to the bit-shifter;
    connecting a mux to the second additive element and the bit-shifter;
    outputting from the mux to the second memory element of the LE hard decision memory one of an output from the bit-shifter or an output from the second additive element;
    connecting a check node unit array to the second additive element;
    storing Q sign bits in a Q sign memory;
    connecting a first current-to-voltage generator to the Q sign memory;
    producing an old R value with the first current-to-voltage generator an old R value and sending the old R value to the second additive element;
    connecting a register array to the check node unit array;

storing one or more variable in the register array from one or more check node units;

connecting a second current-to-voltage generator to the register array; and producing a new R value with the second current-to-voltage generator and sending the new R value to the first additive element.

13. The method of claim 12, further comprising interleaving the two circulants with a global mapping element connected to the first memory element.

14. The method of claim 12, further comprising de-interleaving an output comprising two E values with a global de-mapping element connected to the second memory element.

15. The method of claim 12, further comprising storing in specific memory addresses in the first memory element data associated with the first circulant.

16. The method of claim 12, further comprising processing two or more layers of a low-density parity-check code to decode a low-density parity-check code encoded message.

17. The method of claim 16, wherein the two or more layers are configured to utilize a memory architecture comprising:

a global mapping element;

a first memory element directly connected to the global mapping element;

a global de-mapping element; and a second memory element directly connected to the global de-mapping element.

18. The method of claim 17, further comprising interleaving two circulants according to at least one constraint associated with the two or more layers with a global mapping element connected to the first memory element.

19. The method of claim 12, further comprising receiving one or more encoded messages, a first aligning of one or more encoded bits of the one or more encoded messages, and storing one or more of the aligned one or more encoded bits.

20. The method of claim 19, further comprising at least a second aligning, wherein the second aligning includes aligning one or more bits of the stored encoded bits of at least one of a message, an L value, or an E value to produce an output; de-interleaving the output; interleaving the output; and, sending the output to the LE hard decision memory.

* * * * *